United States Patent [19]

Scholz

[11] 4,420,795

[45] Dec. 13, 1983

[54] ELECTRONIC COMPONENT MOUNTING

[76] Inventor: Donald T. Scholz, 13 Rich Valley Rd., Wayland, Mass. 01778

[21] Appl. No.: 293,361

[22] Filed: Aug. 17, 1981

[51] Int. Cl.³ .............................................. H05K 7/12
[52] U.S. Cl. ..................................... 361/427; 361/405; 361/420; 248/310; 338/197; 338/320
[58] Field of Search .............. 339/17 C; 338/197, 315, 338/320; 361/331, 380, 346, 348, 397, 400, 405, 417, 419, 420, 427; 200/293, 294, 296; 248/27.1, 310, 311.2, 311.3, 314

[56] References Cited

U.S. PATENT DOCUMENTS

| 3,201,654 | 8/1965 | Clark | 361/420 |
| 3,531,076 | 9/1970 | Bang | 338/197 |
| 4,227,238 | 10/1980 | Saito | 339/17 C |

FOREIGN PATENT DOCUMENTS

| 1515622 | 7/1969 | Fed. Rep. of Germany | 338/197 |
| 1000160 | 8/1965 | United Kingdom | 338/197 |

Primary Examiner—G. P. Tolin
Attorney, Agent, or Firm—Wolf, Greenfield & Sacks

[57] ABSTRACT

A mounting bracket supports electronic components, particularly a plurality of resistors in a parallel array. The mounting bracket is secured to a printed circuit board to which the resistors are attached in a predetermined circuit arrangement. The mounting bracket has cut-outs defined by oppositely disposed ears between which the resistor is forcibly placed. The mounting bracket forms a means for holding the resistors to facilitate attachment to the printed circuit board and furthermore forms a permanent support therefor so as to substantially eliminate detachment of the resistors due to vibration or other causes.

7 Claims, 3 Drawing Figures

ELECTRONIC COMPONENT MOUNTING

BACKGROUND OF THE INVENTION

The present invention relates in general to a mounting for electronic components on a printed circuit board or the like, and pertains more particularly, to a mounting preferably adapted for supporting resistors on a printed circuit board. The mounting bracket of this invention is adapted for positioning a series of resistors and furthermore forms a permanent mounting to prevent detachment of the resistors due to vibration or other causes.

Electronic components including inductors, capacitors and resistors are typically secured to a printed circuit board with support being provided only by the leads on the component itself. However, with larger size components such as relatively large wattage resistors, problems of detachment of the resistor from the printed circuit board have occurred. This is particularly the case when the printed circuit board might be subjected to any vibrations or other mechanical strain.

Accordingly, it is an object of the present invention to provide a mounting bracket for an electronic component, particularly a resistor of higher wattage, and which provides a permanent mount for the resistor adding support thereto in addition to the support of the resistor provided by the terminals thereof.

Another object of the present invention is to provide an improved mounting for electronic components wherein the component can be mounted simply by a force-fitting.

Still another object of the present invention is to provide an improved mounting for resistors or the like which is simple in construction, simple to use, inexpensive to fabricate, and may be fabricated quite easily for supporting a number of components.

SUMMARY OF THE INVENTION

To accomplish the foregoing and other objects of this invention, there is provided a mounting bracket which is adapted for supporting electronic components. In the embodiment described herein there are shown high wattage electronic resistors that are supported by the mounting bracket. This mounting is in addition to some degree of mounting that is provided by the terminals of the resistor itself. The mounting bracket preferably comprises two right angle elongated legs, one of which is adapted to rest upon the surface of a printed circuit board. In this connection, means such as rivets may be used for securing this leg to the printed circuit board. The resistors are adapted to be positioned orthogonally to the elongated mounting bracket supported in the other leg of the mounting bracket. For this purpose the bracket is provided with cut-outs from which are formed pairs of oppositely disposed ears between which the individual resistors are mounted. The ears are preferably a few degrees out of the orthogonal direction so that the resistors are force-fitted into the cut-out. The ends of the resistors with the terminals attached at the end extend to either side of the bracket with the terminals extending into the printed circuit board where they are attached. The end terminals of the resistor may be attached to the printed circuit board in the conventional manner usually employing a soldering technique. In one embodiment, 20 watt resistors are mounted and the bracket is adapted to receive resistors of different dimension. However, it is preferred that the tops of all resistors be in line. And in this regard the bracket is thus provided with different depth cut-outs depending upon the particular resistor that is to be mounted. The bracket may be constructed of a cold rolled steel and the ears are preferably formed from the cut-out that is provided so that they are integral with the bracket.

BRIEF DESCRIPTION OF THE DRAWING

Numerous other objects, features and advantages of the invention should now become apparent upon a reading of the following detailed description taken in conjunction with the accompanying drawing, in which.

DETAILED DESCRIPTION

Figure 1:
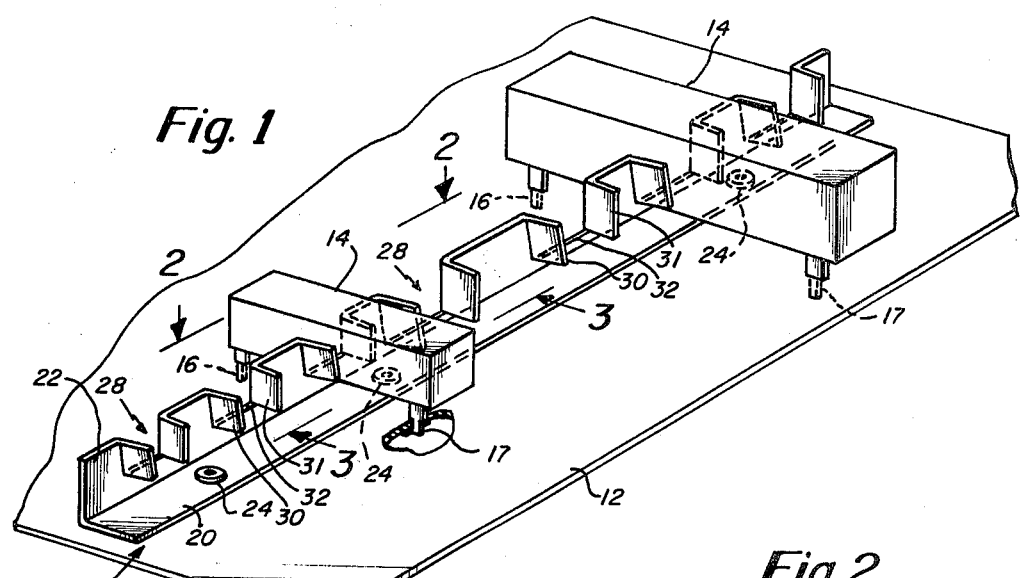
FIG. 1 is a fragmentary perspective view showing the component mounting structure of the present invention.
Figure 2:
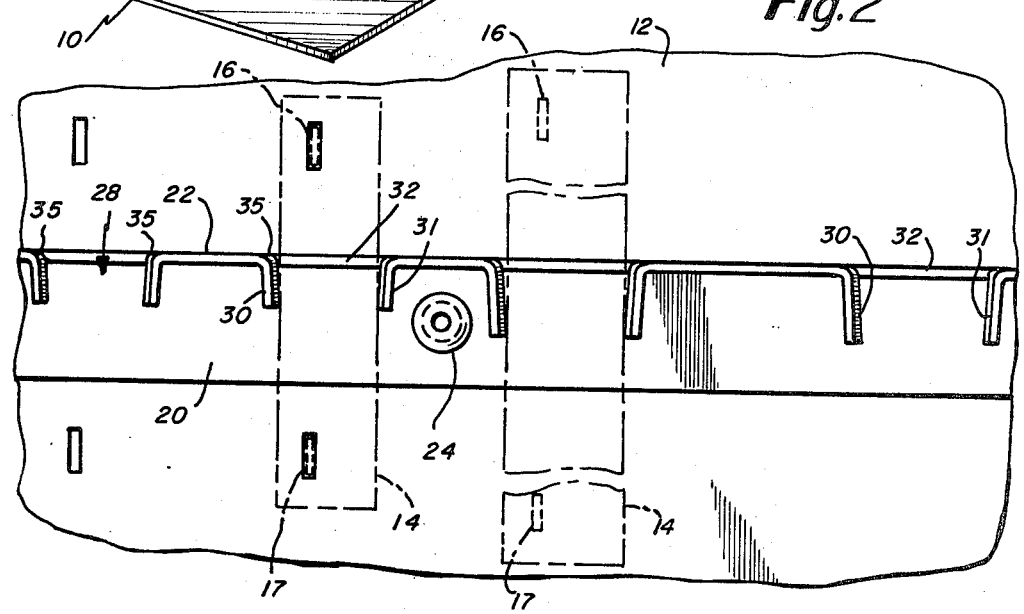
FIG. 2 is a plan view taken along line 2—2 of FIG. 1.
Figure 3:
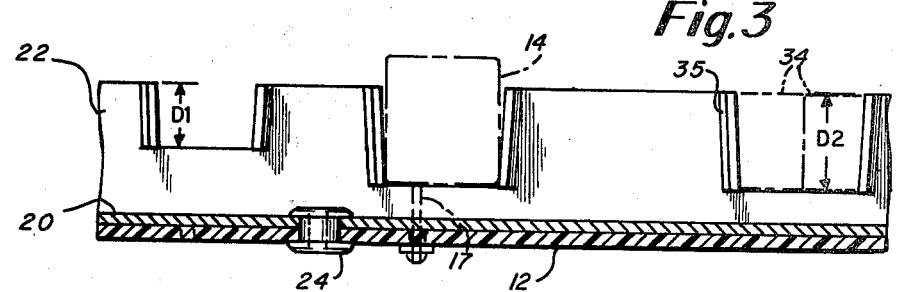
FIG. 3 is a cross-sectional view taken along line 3—3 of FIG. 1.

Referring now to the drawing, there is shown a preferred form of the electronic component mounting apparatus of this invention. This comprises a bracket 10 which is adapted to be supported to a printed circuit board 12 at a proper predetermined location so that the components mounted by the bracket are in proper position for conductive contact with conductors on the printed circuit board. In the disclosed embodiment, the bracket 10 is for mounting a series of high power ceramic resistors 14. In the drawing these are shown as basically in two different sizes although they may be in a variety of different sizes. Each resistor 14 has end terminals 16, 17 which are secured by a conventional technique to a printed circuit board. For example, these terminals may simply be soldered to the copper conductive strips on the printed circuit board.

The bracket 10 may be constructed of a cold rolled steel having thickness of 0.022±0.002 inch. The bracket is formed with a pair of legs including a horizontal leg 20 and an upright leg 22. The horizontal leg 20 is fixed to the printed circuit board such as with the use of a series of rivets 24. Alternatively, arrangements could be used such as the use of a small bolt or the use of an epoxy glue.

The upright leg 22 is cut-out or punched out in a particular pattern to provide apertures 28 adapted for receiving the resistor 14. The aperture 28 is formed by integral oppositely disposed ears 30, 31 between which the resistor is mounted. It is noted in the drawing that each of these ears extend a relatively small angle out of the orthogonal direction to the leg 22. There is typically provided about a 3° taper. This is provided so that the resistor can be force-fitted between the ears 30 and 31. The resistor rests on the surface 32 formed by the cut-out.

The ears are cut directly from the leg or punched out and in this connection in the drawing there is shown in dotted outline at 34, the T-shaped cut that is made and from which the ears are formed and may be bent along the general bend lines 35.

The depth of the apertures may vary depending upon the size of resistor that is to be mounted. Thus, in the drawing, one series of aperture has a depth D1 for accommodating a smaller valued resistor while other ones of the apertures have a deeper depth D2 for accommodating larger wattage resistors. However, the ends of the terminals 16, 17 regardless of the size resistor that is employed, terminate at the same height relative to the bracket so that they are in the proper position with regard to the printed circuit board.

For the smaller value resistor that is depicted, the width of the aperture between the ears may be on the order of 0.36 inch. For the larger wattage resistor the width between the ears may be on the order of 0.49 inch. As indicated previously, the ears are tapered slightly and are adapted to have a spacing somewhat less than the width of the resistor so that the resistor can be inserted and force-fitted between the ears and held relatively stationary by the ears. Thus, in accordance with the invention the bracket forms a means by which the resistors are held in position for attachment to the printed circuit board. Furthermore, the bracket forms a permanent support for the resistors to maintain them secured to the board even under high conditions of vibration.

Having described one embodiment of the present invention, it should now be apparent to those skilled in the art that numerous other embodiments are contemplated as falling within the scope of this invention. For example, the resistor receiving apertures may be of varied size and depth. Also, the bracket may be used for mounting other components such as inductors or capacitors or even semiconductor components.

What is claimed is:

1. A mounting apparatus positioning and mounting electronic components such as high wattage resistors to a substrate board and comprising an elongated bracket having two elongated legs, means securing one of the legs to the substrate board including means for positioning the bracket intermediate predetermined points of attachment of the electronic components, the other of the legs extending substantially normal to the substrate board and having spacedly disposed and integral therewith a plurality of pairs of cut-out ears, each pair of ears extending substantially normal to said other leg and defining an aperture in the leg which receives a respective electronic component, said electronic components extending substantially orthogonally to the length of the bracket and said predetermined points of attachment including a terminal extending at least one on each side of the bracket, said ears being positioned to form an aperture width dimensioned relative to the component width to assure a force-fit of the component into the aperture.

2. A mounting apparatus as set forth in claim 1 including apertures of different size to accommodate resistors of different wattage.

3. A mounting apparatus as set forth in claim 1 wherein the bracket is constructed of a cold rolled steel.

4. A mounting apparatus as set forth in claim 1 wherein said electronic components are each mounted for engagement with the support bracket at about the mid-point of the electronic component.

5. A mounting apparatus as set forth in claim 1 wherein the ears are a small degree angle out of the orthogonal to said other leg to provide an interference fit between each component and the ears.

6. A mounting apparatus as set forth in claim 5 wherein each component is of square or rectangular cross-section.

7. A mounting apparatus as set forth in claim 1 wherein there are provided terminals at each respective end of each electronic component so that the terminals are one on each side of the bracket.

* * * * *